United States Patent
Kang et al.

(10) Patent No.: US 7,142,022 B2
(45) Date of Patent: Nov. 28, 2006

(54) CLOCK ENABLE BUFFER FOR ENTRY OF SELF-REFRESH MODE

(75) Inventors: Tae Jin Kang, Ichon-Shi (KR); Kee Teok Park, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/739,232

(22) Filed: Dec. 18, 2003

(65) Prior Publication Data

US 2005/0024096 A1  Feb. 3, 2005

(30) Foreign Application Priority Data

Aug. 1, 2003 (KR) .................... 10-2003-0053430

(51) Int. Cl.
*G01R 19/00* (2006.01)
(52) U.S. Cl. .......................................... 327/53; 327/56
(58) Field of Classification Search ............... 327/53, 327/56, 66, 77, 78, 85, 89, 562, 563, 108, 327/291, 299; 330/257; 365/203, 207, 222; 316/82, 83
See application file for complete search history.

(56) References Cited

U.S. PATENT DOCUMENTS 5,305,272 A * 4/1994 Matsuo et al. ......... 365/189.11
5,789,948 A * 8/1998 Kim et al. .................... 327/53
5,801,554 A * 9/1998 Momma et al. .............. 327/77
6,184,744 B1 * 2/2001 Morishita ................... 327/541

FOREIGN PATENT DOCUMENTS

JP   9-294062   11/1997

* cited by examiner

*Primary Examiner*—Long Nguyen
(74) *Attorney, Agent, or Firm*—Marshall, Gerstein & Borun LLP

(57) ABSTRACT

A clock enable buffer for entry of a self-refresh mode. The clock enable buffer includes a current mirror load connected between a voltage source and first and second nodes, wherein the current mirror load has first and second transistors; a third transistor connected between the first node and a third node, wherein the third transistor is turned on according to a reference voltage; a fourth transistor connected between the second node and the third node, for controlling the current mirror load in response to a clock enable signal; a fifth transistor connected between the third node and a ground, wherein the fifth transistor is turned on according to a self-refresh signal; and a sixth transistor that is turned on according to an inverted self-refresh signal to make the potential of the first node a Low level.

3 Claims, 3 Drawing Sheets

US 7,142,022 B2

CLOCK ENABLE BUFFER FOR ENTRY OF SELF-REFRESH MODE

BACKGROUND

1. Technical Field

A clock enable buffer is disclosed which can reduce current consumption and malfunction due to noise, and which can be used in a stub-series terminated logic (hereinafter, referred to as 'SSTL') interface, while using a differential buffer.

2. Discussion of Related Art

JEDEC rules entry and exit at the time of a self-refresh mode of semiconductor memory devices such as DRAMs. In other words, according to the rules, the entry refers to what a clock enable signal (CKE) shifts from a High level to a Low level and the exit refers to what the clock enable signal (CKE) shifts from a Low level to a High level.

An important thing relating to such a self-refresh entry is to use a circuit that can consume only a minimum current, which may be used in DRAMs. An input buffer used at the time of the self-refresh entry includes a static buffer that consumes a small amount of current. The static buffer has a possibility that malfunction may take place due to its property sensitive to noise and rarely uses a SSTL interface. As a differential buffer consumes a For the above reason, a clock enable buffer uses a static buffer as shown in FIG. 2 in a self-refresh mode, which consumes 1000 times less current than a differential buffer, while using a differential buffer as shown in FIG. 1 in a normal mode, which consumes a large amount of current. At the time of the self-refresh entry, a modified differential buffer as shown in FIG. 3 instead of the static buffer may be used, but it also consumes a great amount of current.

FIG. 1 is a detailed circuit diagram showing a differential buffer used in a normal mode in a related art.

Referring to FIG. 1, if a self-refresh signal (sref) is Low, the output of an inverter I1 becomes a High level and an NMOS transistor N3 is thus turned on. Therefore, if a clock enable signal (CKE) is High, i.e., the clock enable signal (CKE) is higher than a reference voltage (vref), an NMOS transistor N1 is turned on earlier than an NMOS transistor N2. Accordingly, the output (Vout1) becomes a Low level.

Meanwhile, if the clock enable signal (CKE) is lower than the reference voltage (vref), the NMOS transistor N2 is turned on earlier than the NMOS transistor N1. The output (Vout1) thus becomes a High level. As a result, PMOS transistors P1 and P2 functions as a load for supplying a static voltage.

FIG. 2 is a detailed circuit diagram of a static buffer that consumes 1000 times less current than the differential buffer as shown in FIG. 1.

If a self-refresh signal (sref) is High, an NMOS transistor N5 is turned on, while a PMOS transistor P4 is turned off. If a clock enable signal (CKE) is Low, a PMOS transistor P3 is turned on and an output (Vout2) thus becomes a High level.

Meanwhile, if the clock enable signal (CKE) is High, the PMOS transistor P3 is turned off and the output (Vout2) thus becomes a Low level.

A delay unit 10 is for allowing the static buffer to operate after a given delay time since the differential buffer is turned off upon entry of a self-refresh mode. That is, the delay unit 10 functions to prevent two buffers from operating at the same time.

In order to reduce malfunction due to noise and for a SSTL interface to be used, a differential buffer as shown in FIG. 3 may be used instead of the circuit as shown in FIG. 2, upon entry of the self-refresh mode.

The operation of such a differential buffer is same as that of the circuit shown in FIG. 1. A delay unit 20 is for allowing the static buffer to operate after a given delay time since the differential buffer is turned off upon entry of the self-refresh mode. That is, the delay unit 20 functions to prevent two buffers from operating at the same time.

A region (A) in FIG. 4 is a period where the clock enable signal (CKE) is High and the self-refresh mode is Low. During this period, the differential buffer is operated. A region (B) is a period where the clock enable signal (CKE) is Low and the self-refresh mode is High. During this period, the static buffer is operated.

As described above, if the static buffer is used as the clock enable buffer upon entry of the self-refresh mode, there are problems that a circuit is greatly affected by noise and does not use the SSTL interface. If the differential buffer is used, there is a disadvantage that a great amount of power is consumed.

SUMMARY OF THE DISCLOSURE

A clock enable buffer is disclosed that can substantially obviate the above problems.

The disclosed clock enable buffer can reduce current consumption and malfunction due to noise, and can be used in a stub series terminated logic (SSTL) interface, while using a differential buffer.

A disclosed clock enable buffer for entry of a self-refresh mode comprises a current mirror load connected between a voltage source and first and second nodes, wherein the current mirror load has first and second transistors; a third transistor connected between the first node and a third node, wherein the third transistor is turned on according to a reference voltage; a fourth transistor connected between the second node and the third node, for controlling the current mirror load in response to a clock enable signal; a fifth transistor connected between the third node and a ground, wherein the fifth transistor is turned on according to a self-refresh signal; and a sixth transistor that is turned on according to an inverted self-refresh signal to make the potential of the first node a Low level.

DETAILED DESCRIPTION OF THE PRESENTLY PREFERRED EMBODIMENTS

Figure 5:
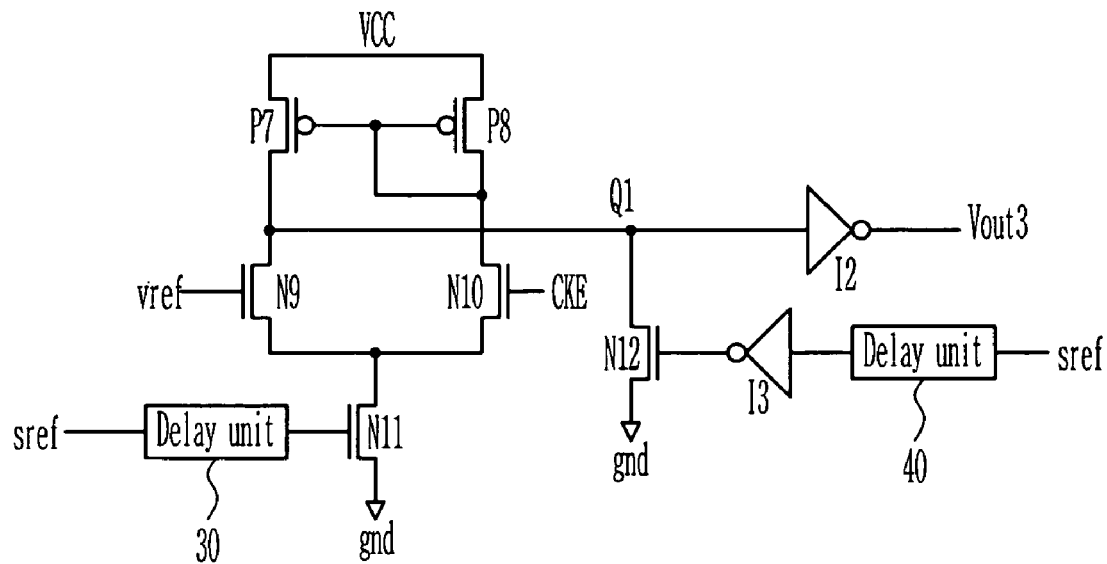
FIG. 5 is a detailed circuit diagram of a clock enable buffer used in a self-refresh mode according to a first embodiment.

FIG. 5 is a detailed circuit diagram of a clock enable buffer used upon entry of a self-refresh mode according to a first embodiment. The operation of the clock enable buffer will now be described with reference to FIG. 5. A current mirror type differential buffer is used upon entry of the self-refresh mode.

Figure 1:
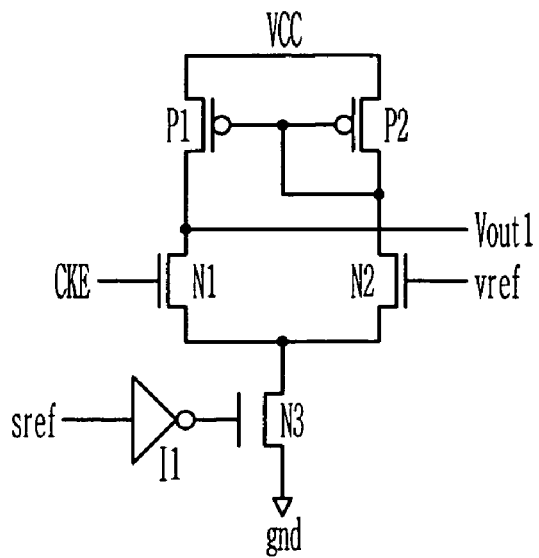
FIG. 1 is a detailed circuit diagram showing a differential buffer used in a normal mode in a related art.
Figure 2:
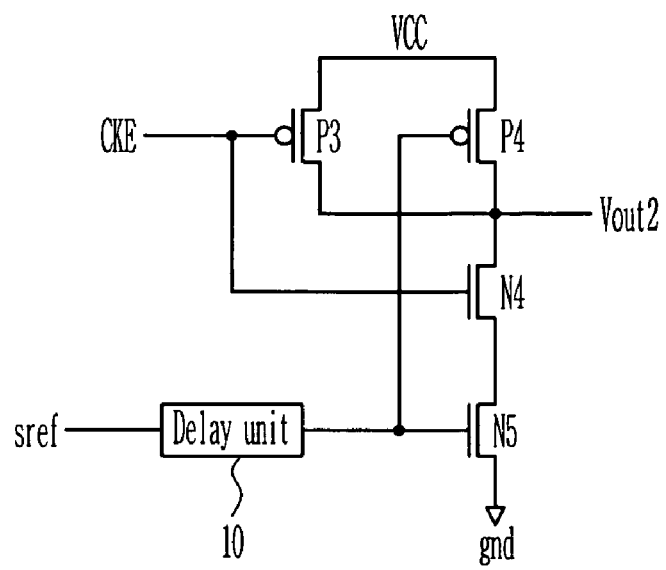
FIG. 2 is a detailed circuit diagram showing a static buffer in a related art.

If a self-refresh signal (sref) is Low, the differential buffer as shown in FIG. 1 is used. If the self-refresh signal (sref) is High, the clock enable buffer shown in FIG. 5 is used. In other words, in a normal mode, the differential buffer shown in FIG. 1 is used. In a self-refresh mode, an improved differential buffer as shown in FIG. 5 is used.

If the self-refresh signal (sref) is Low, an NMOS transistor N11 is turned off, while an NMOS transistor N12 is turned on. Accordingly, the potential of a node Q1 becomes a Low level and an output of an inverter 13 thus becomes a High level. In this case, although a clock enable signal (CKE) has any level, the output (Vout3) always keeps a High level.

If a self-refresh mode is entered, i.e., if the clock enable signal (CKE) becomes a Low level and the self-refresh signal (sref) becomes a High level, that is, if the clock enable signal (CKE) is lower than a reference voltage (vref), an NMOS transistor N9 is turned on earlier than an NMOS transistor N10. As the node Q1 becomes a Low level, the output (Vout3) becomes a High level.

Figure 3:
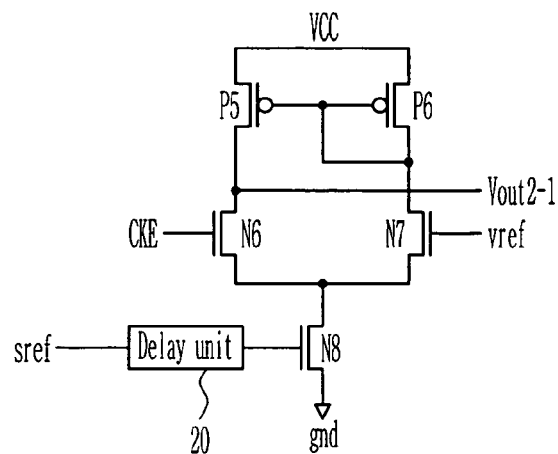
FIG. 3 is a detailed circuit diagram showing a differential buffer used in a self-refresh mode in a related art.
Figure 4:
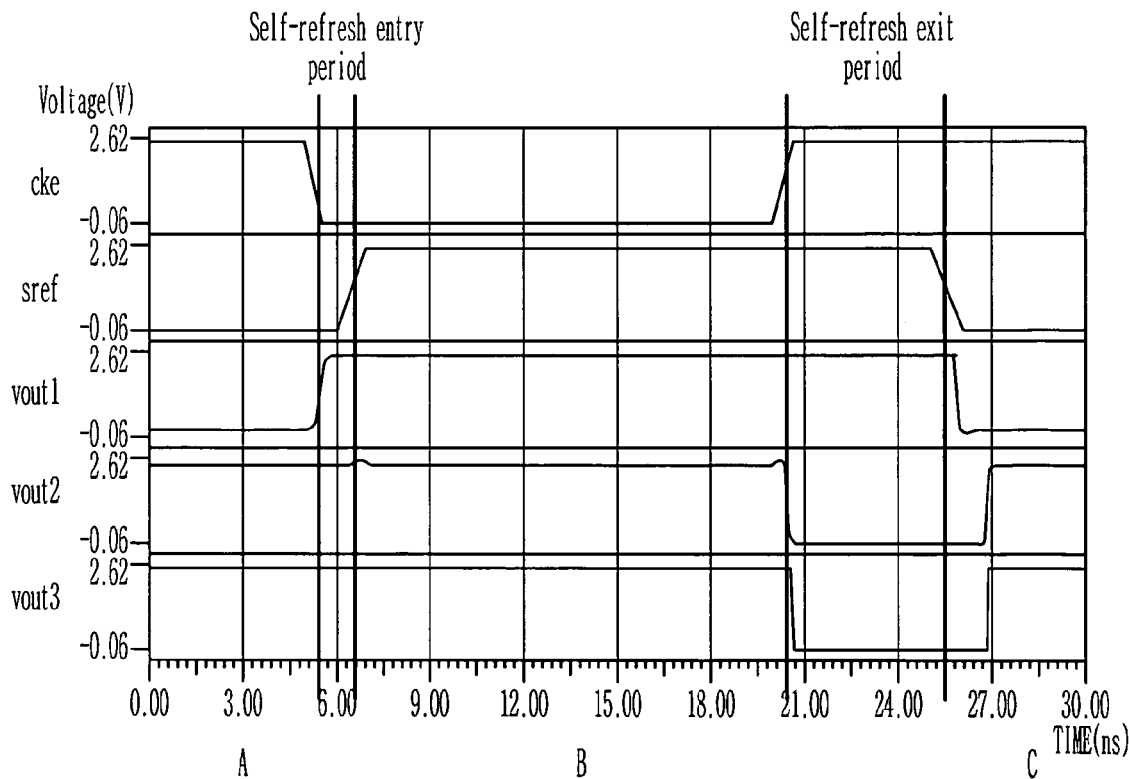
FIG. 4 is a timing diagram shown to explain an operating period of the differential buffer and the static buffer.

At this time, although the self-refresh signals (sref) inputted to gates of NMOS transistors N11 and N12 are inverted, the level of the node Q1 always keeps a Low level. The reason is because the clock enable signal (CKE) is Low. The current consumed at this time is only 1/1000 of a conventional differential buffer. This is because as a level of 0V (CKE≦0.2V upon entry of a self-refresh mode in JEDEC spec.) is applied to the gate of the NMOS transistor N10, the amount of current consumed is smaller than that in case of FIG. 3 (in FIG. 3, a given amount of current is consumed since a reference voltage of a given level (usually Vcc/2 or more) is always applied to the gate of the NMOS transistor N7).

Meanwhile, if the clock enable signal (CKE) is higher than the reference voltage (vref), the NMOS transistor N10 is turned on earlier than the NMOS transistor N9. Thus, the output (Vout3) becomes a Low level.

Resultantly, if the clock enable signal (CKE) is higher than the reference voltage (vref), the output (Vout3) becomes a Low level. Meanwhile, if the clock enable signal (CKE) is lower than the reference voltage (vref), the output (Vout3) becomes a High level. PMOS transistors P7 and P8 function as loads for supplying a static voltage. A delay unit 40 is used to allow a clock enable buffer to operate after a given delay time since a differential buffer is turned off at the time of a self-refresh entry. That is, the delay units 30 and 40 are used to prevent two buffers (FIG. 1 and FIG. 5) from operating at the same time.

If a self-refresh exit mode is entered, as the clock enable signal (CKE) shifts from a Low level to a High level, the output (Vout3) shifts from a High level to a Low level. This signal is transferred to the inside of a chip, which makes the self-refresh signal a Low level. Therefore, the differential buffer as shown in FIG. 1 operates.

Figure 6:
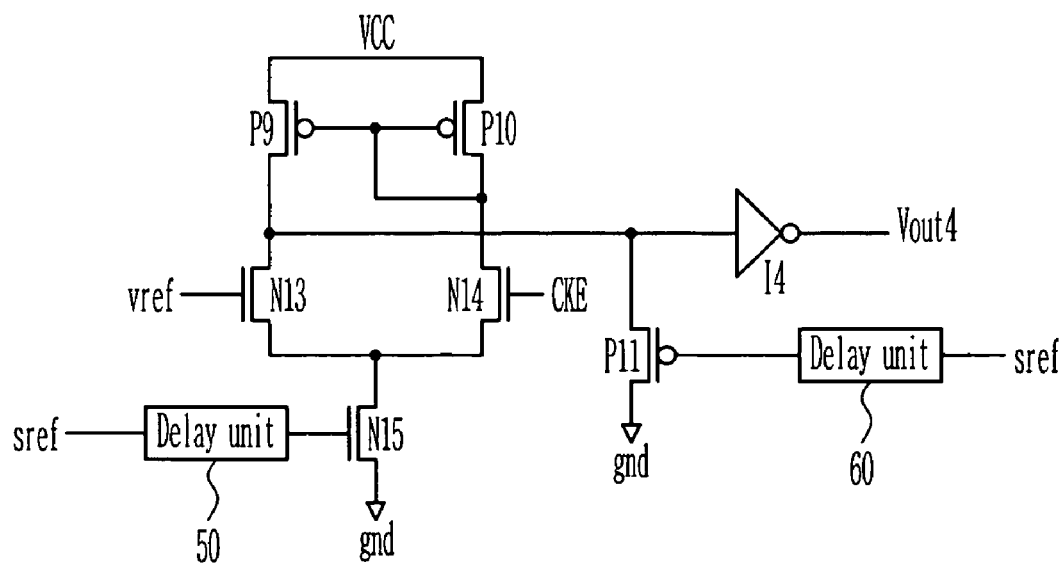
FIG. 6 is a detailed circuit diagram of a clock enable buffer used in a self refresh mode according to a second embodiment.

FIG. 6 is a detailed circuit diagram showing a clock enable buffer used in a self-refresh mode according to a second embodiment.

The configuration of FIG. 6 is same as that of FIG. 5 except that the NMOS transistor N12 in FIG. 5 is replaced with a PMOS transistor P11 and the inverter 13 in FIG. 5 is removed.

Since the operation of the clock enable buffer shown in FIG. 6 is not different from those shown in FIG. 5, description on it will be omitted in order to avoid redundancy.

According to the present invention clock enable buffer as described above, the amount of current consumed is reduced by changing an input terminal to which a reference voltage of a current mirror type differential buffer is inputted and a position to which a clock enable signal is inputted. Therefore, the disclosed clock enable buffers have an effect that they can overcome disadvantages inherent in the prior art differential buffers. Furthermore, the disclosed clock enable buffers have an advantage that they can use an input signal as a SSTL interface, while reducing malfunction due to noise, a shortcoming of the static buffer.

Although the foregoing description has been made with reference to certain preferred embodiments, it is to be understood that changes and modifications may be made by one of ordinary skill in the art without departing from the spirit and scope of this disclosure and the appended claims.

What is claimed is:

1. A clock enable buffer for entry of a self-refresh mode, comprising:
    a current mirror load connected between a voltage source and a first node and a second node, wherein the current mirror load has first and second transistors;
    a third transistor connected between the first node and a third node, wherein the third transistor is turned on according to a reference voltage;
    a fourth transistor connected between the second node and the third node, for controlling the current mirror load in response to a clock enable signal;
    a first delay unit for delaying a self-refresh signal;
    a fifth transistor connected between the third node and a ground, wherein the fifth transistor is turned on according to a first delayed self-refresh signal by the first delay unit;
    a second delay unit for delaying the self-refresh signal; and
    a sixth transistor that is turned on according to an inverted version of a second delayed self-refresh signal by the second delay unit to make the potential of the first node a Low level,
    wherein an output of the clock enable buffer for entry of the self-refresh mode is generated at the first node.

2. The clock enable buffer as claimed in claim 1, wherein each of the first and second transistors consists of a PMOS transistor.

3. The clock enable buffer as claimed in claim 1, wherein each of the third to sixth transistors consists of an NMOS transistor.

* * * * *